(12) United States Patent
Zhang et al.

(10) Patent No.: US 10,181,101 B2
(45) Date of Patent: Jan. 15, 2019

(54) SUPPORT VECTOR MACHINE ENHANCED MODELS FOR SHORT-TERM WIND FARM GENERATION FORECASTING

(71) Applicants: Junshan Zhang, Chandler, AZ (US); Miao He, Tempe, AZ (US); Lei Yang, Tempe, AZ (US); Vijay Vittal, Scottsdale, AZ (US)

(72) Inventors: Junshan Zhang, Chandler, AZ (US); Miao He, Tempe, AZ (US); Lei Yang, Tempe, AZ (US); Vijay Vittal, Scottsdale, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 433 days.

(21) Appl. No.: 14/572,385

(22) Filed: Dec. 16, 2014

(65) Prior Publication Data

US 2015/0154504 A1 Jun. 4, 2015

Related U.S. Application Data

(63) Continuation-in-part of application No. 14/109,586, filed on Dec. 17, 2013, now Pat. No. 9,460,478.

(51) Int. Cl.
| | | |
|---|---|---|
| *G06N 7/00* | (2006.01) |
| *F03D 7/04* | (2006.01) |
| *G06Q 10/04* | (2012.01) |
| *G06Q 50/06* | (2012.01) |
| *G01W 1/10* | (2006.01) |

(Continued)

(52) U.S. Cl.
CPC ............. *G06N 7/005* (2013.01); *F03D 7/048* (2013.01); *G01W 1/10* (2013.01); *G06Q 10/04* (2013.01); *G06Q 50/06* (2013.01); *G01R 21/133* (2013.01); *H02J 3/386* (2013.01); *H02J 2003/007* (2013.01); *Y02E 10/763* (2013.01); *Y02E 60/76* (2013.01); *Y04S 10/54* (2013.01); *Y04S 40/22* (2013.01)

(58) Field of Classification Search
CPC ...................................................... G06N 7/005
See application file for complete search history.

(56) References Cited

U.S. PATENT DOCUMENTS

| | | |
|---|---|---|
| 6,975,925 B1 | 12/2005 | Barnes et al. |
| 8,200,435 B2 | 6/2012 | Stiesdal |
| 2012/0046917 A1 | 2/2012 | Fang et al. |

OTHER PUBLICATIONS

H. Madsen, P. Pinson, G. Kariniotakis, H.A. Nielsen, and T. S. Nielsen, "Standardizing the performance evaluation of short-term wind power prediction models," Wind Engineering, vol. 29, No. 6, pp. 475-489, 2005.

(Continued)

*Primary Examiner* — Manuel A Rivera Vargas
(74) *Attorney, Agent, or Firm* — Snell & Wilmer L.L.P.

(57) ABSTRACT

Systems and methods for forecasting wind farm power generation are disclosed. Via use of a support vector machine (SVM) enhanced Markov model, short-term wind power generation forecasts may be generated. Exemplary approaches accurately account for wind ramp-up and ramp-down, as well as diurnal non-stationarity and seasonality of wind power generation. Via use of the disclosed forecasting approaches, utilities and grid managers can make improved decisions relating to electrical power generation and transmission, thus reducing costs and reducing pollution.

11 Claims, 12 Drawing Sheets

Related U.S. Application Data

(60) Provisional application No. 61/916,384, filed on Dec. 16, 2013, provisional application No. 61/738,178, filed on Dec. 17, 2012.

(51) Int. Cl.
    *H02J 3/38*     (2006.01)
    *H02J 3/00*     (2006.01)
    *G01R 21/133*     (2006.01)

(56) References Cited

OTHER PUBLICATIONS

L.Yang et al., "Stochastic Optimization Based Economic Dispatch and Interruptible Load Management with Distributional Forecast of Wind Farm Generation," 53rd IEEE Conference on Decision and Control, L.A., Cal., pp. 199-204, Dec. 15-17, 2014.

Ucilia Wang, "What Electric Grid Operators Want: Good Wind Energy Forecasts," Forbes (May 30, 2012) http://www.forbes.com/sites/uciliawang/2012/05/30/what-electric-grid-operators-want-good-wind-energy-forecasts/.

A. Carpinone et al., "Very Short-Term Probabilistic Wind Power Forecasting Based on Markov Chain Models," pp. 107-112, IEEE PMAPS 2010.

L. Yang, "Stochastic Optimization and Real-Time Scheduling in Cyber-Physical Systems", PhD thesis, Arizona State University, Dec. 2012.

R. Burrett, et al., "Renewables Global Status Report," Renewable Energy Policy Network for the 21st Century, 2009.

J.L. Torres, et al., "Forecast of Hourly Average Wind Speed with ARMA Models in Navarre (Spain)," Solar Energy, vol. 79, No. 1, pp. 65-77, 2005.

K.S. Cory and B.G. Swezey, "Renewable Portfolio Standards in the States: Balancing Goals and Implementation Strategies," NREL Technical Report TP-670-41409, Dec. 2007.

G. Kariniotakis, et al., "Advanced Short-term Forecasting of Wind Generation—Anemos," IEEE Transactions on Power Systems, 2006.

C. W. Potter and M. Negnevistsky, "Very Short-Term Wind Forecasting for Tasmanian Power Generation," 21 IEEE Transactions on Power Systems, vol. 21, No. 2, pp. 965-972, May 2006.

M. S. Miranda and R. W. Dunn, "One-hour-ahead Wind Speed Prediction Using a Bayesian Methodology," IEEE Power Engineering Society General Meeting, 2006.

M. He, S. Murugesan and J. Zhang, "Multiple Timescale Dispatch and Scheduling for Stochastic Reliability in Smart Grids with Wind Generation Integration," Proc. IEEE Infocom 2011 Mini-Conference, Shanghai, China, pp. 461-465, Apr. 2011.

P. P. Varaiya, F. F. Wu and J. W. Bialek, "Smart Operation of Smart Grid: Risk-Limiting Dispatch," Proceedings of the IEEE, vol. 99., No. 1, pp. 40-57, Jan. 2011.

S. Murugesan, J. Zhang and V. Vittal, "Finite State Markov Chain Model for Wind Generation Forecast: A Data-driven Spatio-temporal Approach," Innovative Smart Grid Technologies, 2012 IEEE PES, pp. 1-8, Jan. 2012.

N. Abdel-Karim, M. Small and M. Ilic, "Short Term Wind Speed Prediction by Finite and Infinite Impulse Response Filters: A State Space Model Representation Using Discrete Markov Process," IEEE Bucharest Power Tech Conference, Bucharest, 2009.

M. E. J. Newman, "Power Laws, Pareto Distributions and Zipfs Law," Contemporary Physics, vol. 46, No. 5, pp. 323-351, 2005.

R. C. Prim, "Shortest Connection Networks and Some Generalizations," The Bell System Technical Journal, vol. 36, pp. 1389-1401, Nov. 1957.

E. S. Takle and J. M. Brown, "Note on the Use of Weibull Statistics to Characterize Wind Speed Data," Journal of Applied Meteorology, 17, pp. 556-559, Apr. 1978.

Q. Zhang and S. A. Kassam,"Finite-state Markov Model for Rayleigh Fading Channels," IEEE Transactions on Communications, vol. 47, No. 11, pp. 1688-1692, Nov. 1999.

G. Papaefthymiou and B. Klockl, "MCMC for Wind Power Simulation," IEEE Transactions on Energy Conversion, vol. 23, No. 1, pp. 234-240, Mar. 2008.

M. He, et al., "A Spatio-temporal Analysis Approach for Short-Term Forecast of Wind Farm Generation", 29 IEEE Transactions on Power Systems, vol. 29, No. 4, pp. 1611-1622, Jul. 2014.

L. Xie, P. Carvalho, L. Ferreira, J. Liu, B. Krogh, N. Popli, and M. Ilic, "Wind Integration in Power Systems: Operational Challenges and Possible Solutions," Proceedings of the IEEE, vol. 99, No. 1, pp. 214-232, Jan. 2011.

D. Lew, M. Milligan, G. Jordan, and R. Piwko, "The Value of Wind Power Forecasting," NREL Conference Paper CP-5500-50814, Apr. 2011.

G. Giebel, R. Brownsword, G. Kariniotakis, M. Denhard, and C. Draxl, "The State of the Art in Short-Term Prediction of Wind Power—A Literature Overview, 2nd Edition," ANEMOS.plus/safewind, Jan. 2011, available at, http://www.anemos-plus.eu/images/pubs/deliverables/aplus.deliverable d1.2.stp sota v1.1.pdf.

C. Monteiro, H. Keko, R. Bessa, V. Miranda, A. Botterud, J. Wang, G. Conzelmann, and I. Porto, "A Quick Guide to Wind Power Forecasting: State-of-the-art 2009," Argonne National Laboratory, Nov. 2009, available at, http://www.dis.anl.gov/pubs/65614.pdf.

P. Pinson and H. Madsen, "Probabilistic Forecasting of Wind Power at the Minute Time-Scale with Markov-Switching Autoregressive Models," in Probabilistic Methods Applied to Power Systems, Proceedings of the 10th International Conference, pp. 1-8, May 2008.

P. Pinson and H. Madsen, "Adaptive Modelling and Forecasting of Offshore Wind Power Fluctuations with Markov-switching Autoregressive Models," Journal of Forecasting, vol. 31, No. 4, pp. 281-313, 2012.

T. S. Nielsen et al., "Short-term Wind Power Forecasting Using Advanced Statistical Methods," in Proceedings of European Wind Energy Conference, Athens, Greece, pp. 1-9, 2006.

J. Catalao, H. M. I. Pousinho, and V. Mendes, "Hybrid Wavelet-PSO-ANFIS Approach for Short-term Wind Power Forecasting in Portugal," Sustainable Energy, IEEE Transactions, vol. 2, No. 1, pp. 50-59, 2011.

P. Pinson and G. Kariniotakis, "Wind Power Forecasting Using Fuzzy Neural Networks Enhanced with On-line Prediction Risk Assessment," in Power Tech Conference, 2003 IEEE Bologna, vol. 2, 2003.

J. Zeng and W. Qiao, "Support Vector Machine-based Short-term Wind Power Forecasting," in Power Systems Conference and Exposition, 2011 IEEE/PES, pp. 1-8, 2011.

S. Santoso, M. Negnevitsky, and N. Hatziargyriou, "Data Mining and Analysis Techniques in Wind Power System Applications: Abridged," in Power Engineering Society General Meeting, 2006. IEEE, pp. 1-3, 2006.

A. Kusiak, H. Zheng, and Z. Song, "Wind Farm Power Prediction: A Data-mining Approach," Wind Energy, vol. 12, No. 3, pp. 275-293, 2009.

H. Y. Zheng and A. Kusiak, "Prediction of Wind Farm Power Ramp Rates: A Data-mining Approach," ASME Journal of Solar Energy Engineering, vol. 131, pp. 031011-1-031011-8, Aug. 2009.

C. Potter, E. Grimit, and B. Nijssen, "Potential Benefits of a Dedicated Probabilistic Rapid Ramp Event Forecast Tool," in Power Systems Conference and Exposition, IEEE/PES, pp. 1-5, 2009.

H. Zareipour, D. Huang, and W. Rosehart, "Wind Power Ramp Events Classification and Forecasting: A Data Mining Approach," Power and Energy Society General Meeting, 2011 IEEE, pp. 1-3, 2011.

M. Lei, L. Shiyan, J. Chuanwen, L. Hongling, and Z. Yan, "A Review on the Forecasting of Wind Speed and Generated Power," Renewable and Sustainable Energy Reviews, vol. 13, No. 4, pp. 915-920, 2009.

C. Ferreira, J. Gama, L. Matias, A. Botterud, and J. Wang, "A Survey on Wind Power Ramp Forecasting." Argonne National Laboratory, Dec. 2010, available at http://www.dis.anl.gov/pubs/69166.pdf.

(56) References Cited

OTHER PUBLICATIONS

C. Kamath, "Understanding Wind Ramp Events through Analysis of Historical Data," Transmission and Distribution Conference and Exposition, IEEE PES, 2010.

Department of Communications, Energy and Natural Resources, "All Island Grid Study, Work Stream 4, Analysis of Impacts and Benefits." Available at http://www.dcenr.gov.ie/Energy/North-South+Co-operation+in+the+Energy+Sector/All+Island+Electricity+Grid+Study.htm, Jan. 2008.

"WILMAR (Wind Power Integration in Liberalised Electricity Markets)," Available at, http://www.wilmar.risoe.dk/index.htm, Mar. 2012.

L. Yang, et al., "Support Vector Machine Enhanced Markov Model for Short-term Wind Power Forecast," Chapter 3, pp. 35-57, Nov. 2014.

C. W. Hsu and C. J. Lin, "A Comparison of Methods for Multiclass Support Vector Machines," IEEE Transactions on Neural Networks, vol. 13, No. 2, pp. 415-425, Mar. 2002.

C. Hsu, C. Chang, and C. Lin, "A Practical Guide to Support Vector Classification," Department of Computer Science, National Taiwan University, Apr. 2010.

C. C. Chang and C. J. Lin, "LIBSVM: A Library for Support Vector Machines," ACM Transactions on Intelligent Systems and Technology, vol. 2, pp. 27:1-27:27, 2011. Software available at http://www.csie.ntu.edu.tw/cjlin/libsvm.

C. J. Burges, "A Tutorial on Support Vector Machines for Pattern Recognition," Data Mining and Knowledge Discovery, vol. 2, pp. 121-167, 1998.

E. A. DeMeo et al., "Accommodating Wind's Natural Behavior," IEEE Power Energy Magazine, vol. 5, pp. 59-67, Nov.-Dec. 2007.

S. Fink, C. Mudd, K. Porter, and B. Morgenstern, "Wind Energy Curtailment Case Studies," NREL Subcontract Report, Oct. 2009, Rep. SR-550-46716.

F. Cassola and M. Burlando, "Wind Speed and Wind Energy Forecast through Kalman Filtering of Numerical Weather Prediction Model Output," Applied Energy, vol. 99, pp. 154-166, 2012.

P. Pinson and G. Kariniotakis, "Conditional Prediction Intervals of Wind Power Generation," IEEE Transactions on Power Systems, vol. 25, No. 4, pp. 1845-1856, Nov. 2010.

NSF Initiative on "Core Techniques and Technologies for Advancing Big Data Science & Engineering (BIGDATA)," 2012, http://www.nsf.gov/pubs/2012/nsf12499/nsf12499.htm#toc.

A. Lau and P. McSharry, "Approaches for Multi-step Density Forecasts with Application to Aggregated Wind Power," Annals of Applied Statistics, vol. 4, No. 3, pp. 1311-1341, 2010.

P. Pinson, "Very Short-term Probabilistic Forecasting of Wind Power Time-series with Generalized Logit-normal Distributions," J. R. Statist. Soc.: Series C (Applied Statistics), vol. 61, No. 4, pp. 555-576, 2012.

M. He, L. Yang, J. Zhang, and V. Vittal, "Spatio-temporal Analysis for Smart Grids with Wind Generation Integration," International Conference on Computing, Networking and Communications, pp. 1107-1111, 2013.

P. Luh, Y.Yu, B. Zhang, E. Litvinov, T. Zheng, F. Zhao, J. Zhao, and C. Wang, "Grid Integration of Intermittent Wind Generation: A Markovian Approach," IEEE Transactions on Smart Grid, vol. 5, No. 2, pp. 732-741, Mar. 2014.

D. Kugiumtzis and E. Bora-Senta, "Gaussian Analysis of Non-Gaussian Time Series," Brussels Economic Review, vol. 53, No. 2, pp. 295-322, 2010.

NERC IVGTF Task 2.1 report, "Variable Generation Power Forecasting for Operations," May 2010, available at http://www.nerc.com/docs/pc/ivgtf/Task2-1(5.20).pdf.

SUPPORT VECTOR MACHINE ENHANCED MODELS FOR SHORT-TERM WIND FARM GENERATION FORECASTING

CROSS-REFERENCE TO RELATED APPLICATIONS

This application claims priority to, and the benefit of, U.S. Provisional Application Ser. No. 61/916,384 filed on Dec. 16, 2013 and entitled "SUPPORT VECTOR MACHINE ENHANCED MODELS FOR SHORT-TERM WIND FARM GENERATION FORECASTING". This application is also a continuation-in-part of U.S. Ser. No. 14/109,586 filed on Dec. 17, 2013, now U.S. Patent Application Publication No. 2014/0172329 entitled "SYSTEM AND METHOD FOR WIND GENERATION FORECASTING". U.S. Ser. No. 14/109,586 claims priority to and the benefit of U.S. Provisional Application Ser. No. 61/738,178 filed on Dec. 17, 2012 and entitled "SYSTEM AND METHOD FOR WIND GENERATION FORECASTING". Each of the above applications is hereby incorporated by reference in their entirety.

FEDERALLY SPONSORED RESEARCH OR DEVELOPMENT

This invention was made with government support under grant number CPS-1035906 awarded by the National Science Foundation. The government has certain rights in the invention.

TECHNICAL FIELD

The present disclosure relates to forecasting, and in particular to short term forecasting of wind farm power generation.

BACKGROUND

Existing techniques for wind farm generation forecasting are often based on wind speed forecast, which is subsequently translated into the wind power output, and generally assume that wind generation remains the same in the next time slot. In reality, however, the wind generation can vary significantly. In fact, the power outputs from identical turbines within a farm are not necessarily equal, even if the turbines are co-located, and this "mismatch" is particularly severe when they are far apart. Therefore, the applicability of the prior efforts is rather limited, particularly when the farm has a large number of turbines distributed over an extended geographical area. Thus, there is an urgent need to develop a more systematic approach to forecast the farm aggregate wind generation, for example by taking into consideration the temporal and spatial dynamics, and particularly by accounting for wind ramp events.

SUMMARY

In an exemplary embodiment, a method for forecasting power generation in a wind farm comprises identifying, by a processor for forecasting wind farm power generation, relationships among wind turbines in the wind farm using minimum spanning trees; calculating, by the processor and using the minimum spanning trees, power output relationships among the wind turbines; creating, by the processor, a finite state space Markov chain forecast model for the wind turbines in the wind farm; creating, by the processor, a support vector machine (SVM) model for each state in the Markov chain; integrating, by the processor, the SVM model into the Markov model to generate a forecast of the wind farm power generation; and modifying at least one of a generation of electricity or a distribution of electricity based on the predicted power output of the wind farm.

The contents of this summary section are intended as a simplified introduction to the disclosure, and are not intended to limit the scope of any claim.

BRIEF DESCRIPTION OF THE DRAWINGS

With reference to the following description, appended claims, and accompanying drawings:

DETAILED DESCRIPTION

Figure 1:
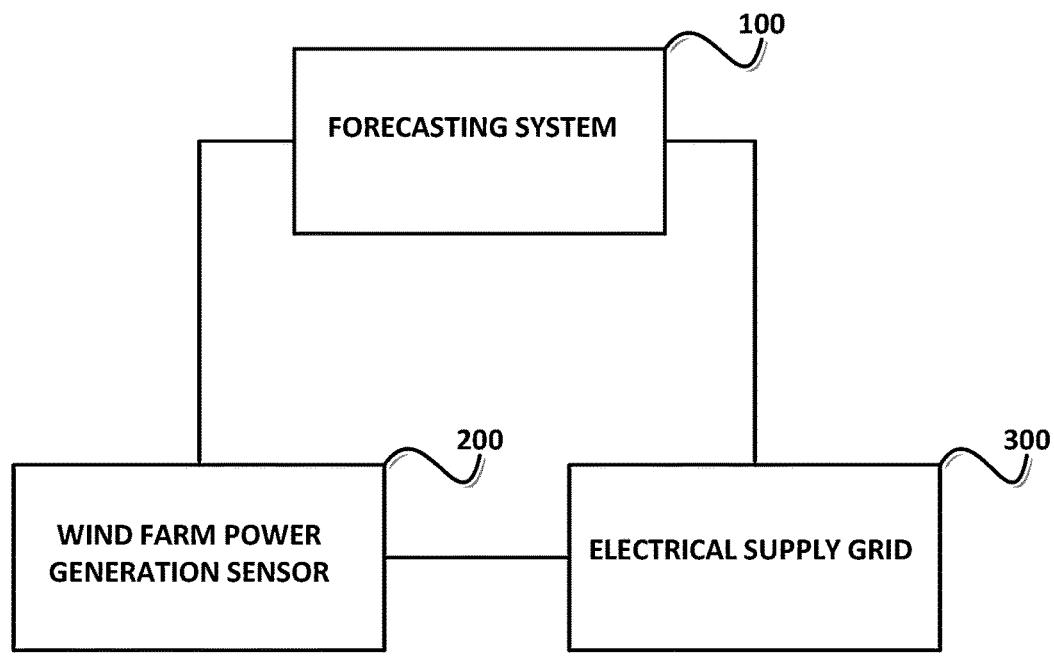
FIG. 1 illustrates a system for wind power generation forecasting in accordance with an exemplary embodiment.

The following description is of various exemplary embodiments only, and is not intended to limit the scope, applicability or configuration of the present disclosure in any way. Rather, the following description is intended to provide a convenient illustration for implementing various embodiments including the best mode. As will become apparent, various changes may be made in the function and arrangement of the elements described in these embodiments without departing from the scope of principles of the present disclosure.

For the sake of brevity, conventional techniques for computer modeling, including spatial and/or temporal analysis, may not be described in detail herein. Furthermore, the connecting lines shown in various figures contained herein are intended to represent exemplary functional relationships and/or physical couplings between various elements. It should be noted that many alternative or additional functional relationships or physical connections may be present in a practical wind power generation forecasting system.

In accordance with principles of the present disclosure, a support vector machine (SVM) enhanced Markov model for short-term wind power forecast may be utilized. Multiple finite-state Markov chains, while taking into account the diurnal nonstationarity and the seasonality of wind generation, may be utilized developed to capture the short-term fluctuations of wind generation. Then, to capture the wind ramp dynamics, SVM is employed to account for wind ramps occurring with specific patterns (as may be reflected in past observations). The SVM can be utilized to forecast wind ramps based on an observed pattern. Further, to capture the diurnal non-stationarity and the seasonality of wind generation, multiple SVM classifiers may be used and each of them is associated with a state in each Markov chain. Then, the forecast by the SVM is integrated into each finite-state Markov chain. Real-world measurement data from wind farms show that principles of the present disclosure, including use of SVM enhanced Markov chains, effectively capture wind ramp dynamics and are well suited to use in wind farm power generation forecasting.

Prior approaches to wind farm power generation forecasting suffer from various deficiencies, for example use of simplistic models, such as persistent prediction of wind speed or linear prediction of wind speed, or persistent point forecast of wind generation. These result in limited forecast accuracy in the presence of wind ramps. Accordingly, baseline electrical generation capacity (e.g., coal, nuclear, gas, hydroelectric, etc.) may either over- or under-produce when estimated wind power generation contributions to the grid are accounted for. Stated another way, uncertainty associated with wind farm power generation levels can result in burning of excess fossil fuels and release of attendant excess greenhouse gases if the grid contribution from wind power is underestimated; moreover, additional electricity may need to be purchased at higher spot market prices if wind power contributions are overestimated. In sum, forecasts of limited accuracy lead to economic and environmental inefficiencies.

In contrast, principles of the present disclosure provide a framework using a SVM enhanced Markov model for short-term wind power forecasting. Wind measurement data obtained from an operational wind farm confirms that principles of the present disclosure result in much higher forecast accuracy in the presence of wind ramps, compared to prior approaches. For example, in certain embodiments, use of an SVM enhanced Markov model for short-term wind farm power generation forecasting resulted in an improved forecast accuracy of at least 49% as compared to persistence and Markov chain forecasts in the presence of a ramp up event. Similarly, in certain embodiments, use of an SVM enhanced Markov model for short-term wind farm power generation forecasting resulted in an improved forecast accuracy of at least 31% as compared to persistence and Markov chain forecasts in the presence of a ramp down event.

By utilizing improved wind power generation forecasts in accordance with principles of the present disclosure, utility companies and/or electrical grid managers can reduce expenditures arising from generation shortfalls. Additionally, utility companies and/or electrical grid managers can reduce excessive fossil fuel consumption arising from undesired excess electrical generation.

Certain nomenclature utilized in this disclosure is as follows:

$d_{i_m}$ distance (the number of hops) between turbine $i_m$ and root turbine $r_m$ in class $C_m$
$f_j(\bullet)$ decision function of the jth class of wind power ramp rate
$\overline{m}$ index of the reference MET
$n_{ij}$ number of transitions from $S_i$ to $S_j$ encountered in the measurement data
$q_k$ transition probability of from $S_k$ to $S_{\hat{k}}$
x 1-dimensional feature vector
y class label of wind power ramp rate
{x, y} training sample
$C_m$ wind turbine class m
$FP_{ag}(\bullet)$ cumulative density function of farm aggregate wind generation
$G_{pw}(\bullet)$ "power curve" of the wind farm, which maps $W_{\overline{m}}(t)$ to $P_{ag}(t)$
$K(\bullet)$ kernel function of an exemplary SVM model
$M_k$ number of wind power ramp rates at state $S_k$
$N_t$ number of measurement data
$N_s$ number of states of Markov chain
$P_{i_m}(t)$ power output of wind turbine $i_m$ in class $C_m$
$P_{r_m}(t)$ power output of root wind turbine $r_m$ in class $C_m$
$P_{ag,m}(t)$ aggregate power output of class $C_m$
$P_{ag}(t)$ aggregate power output of the wind farm
$P_{ag,k}$ representative generation level of state $S_k$
$P_{ag}^{max}$ rated capacity of the wind farm
$\hat{P}_{ag}^{SVM}$ forecast of the wind farm generation by using an SVM model
$\hat{P}_{ag}$ forecast of wind farm power generation
$P_r(A \backslash B)$ probability of event A conditioned on event B
Q transition matrix of an exemplary Markov chain
$R_j^k$ wind power ramp rate of the jth class of wind power ramp rate at state $S_k$
$S_k$ state k in S, $k \in \{1, \ldots, N_s\}$
$S_{\hat{k}}$ forecast state by using an exemplary SVM model
$U_m(\bullet)$ power curve of class $C_m$, which maps $W_m(t)$ to $P_{i_m}(t)$, $\forall i_m \in C_m$
$W_{\overline{m}}(t)$ wind speed measured at the reference MET $\overline{m}$
S state space of Markov chain
$N(\bullet)$ level crossing rate function
$a_m$ linear regression coefficient for the parent-child turbine pairs of $C_m$
$\beta_m$ linear regression coefficient for the wind speed of the root wind turbine of class $C_m$ and the reference MET $\overline{m}$
$\gamma$ regularization parameter
$\phi(\bullet)$ mapping function
$\tau_k$ average duration of state $S_k$
$\sigma^2$ parameter in the kernel function $K(\bullet)$
$\Gamma$ wind farm generation level In order to meet renewable energy portfolio standards adopted by various government entities, much effort is ongoing to integrate renewable power generation, particularly wind power generation, into electrical grids. Increased penetration of wind power generation, however, results in significant operational challenges associated with its variability and non-dispatchability. Reliable system operations (committing and dispatching conventional generation resources) rely on accurate forecasts of future wind power generation.

In the past, wind power generation approaches typically incorporated errors on the order of between about 15% to about 30%, which is significantly larger than typical errors associated with load forecasts. Wind generation forecast errors may result in committing more conventional generation capacity when actual wind generation is above the forecast value, or using costly ancillary generation services or fast acting reserves when the actual wind generation is less than the forecast value. These deviations only increase in significance in the presence of wind ramps.

Prior short-term wind power forecast approaches have been developed, including time-series models (e.g., autoregressive models, Kalman filtering, etc), artificial intelligent methods (e.g., artificial neural networks, fuzzy neural networks, support vector machines (SVMs)) and data mining. Although these prior wind power forecast approaches have been examined well by using wind measurement data from different wind farms, wind power forecast errors can be still high in the presence of wind ramps (a "wind ramp" being an event where the wind power significantly increases or decreases within a limited time window). Large wind energy plants commonly experience changes in wind power output of about 20% or more of rated capacity over about one hour, and wind ramps occur approximately 2% of the time (i.e., about once every two days). Therefore, it remains desirable to accurately detect and forecast wind ramps.

Prior approaches to wind-ramp forecasting have utilized a data-mining approach and/or SVM approach. Both prior approaches apply time-invariant prediction models, and the resulting forecast errors are high. Due to the diurnal non-stationarity and the seasonality of wind generation, suitable prediction models are preferred to be time-variant. Due to the high computational complexity, these prior approaches cannot be easily generalized to take into account the non-stationarity of wind generation. In contrast, principles of the present disclosure develop a SVM-enhanced Markov model for short-term wind power forecasting that takes into account both wind ramps and the diurnal non-stationarity and the seasonality of wind generation.

In various exemplary embodiments, methods for wind power generation forecasting utilize multiple finite-state Markov chains that take into account the diurnal non-stationarity and the seasonality of wind generation to capture the fast fluctuations of small amounts of wind generation. To capture the wind ramp dynamics, SVM may be employed, based on one key observation from exemplary operational wind farm measurement data: wind ramps tend to occur with specific patterns, and those patterns are reflected in historical observations. Accordingly, a SVM can be utilized to forecast wind ramps based on the observed pattern. Additionally, to capture the diurnal non-stationarity and the seasonality of wind generation, multiple SVM classifiers may used and each classifier may be associated with a state in each Markov chain. Thereafter, a forecast by the SVM is integrated into each finite-state Markov chain. Because the forecast by the SVM depends on the past observations, the resulting SVM enhanced Markov chains are time-variant and therefore can potentially capture wind ramp dynamics.

Exemplary systems and methods as disclosed herein have been validated against wind measurement data obtained from an operational wind farm, and the exemplary forecast approaches demonstrate significantly improved accuracy in the presence of wind ramps.

With reference now to FIG. 1, in an exemplary embodiment a forecasting system 100 may be coupled to a wind farm power generation sensor 200 and/or to an electrical grid 300. Via sensor 200, forecasting system 100 receives information regarding current and/or historical wind farm power generation information and/or other information (meteorological information, etc). Forecasting system 100 may be coupled to an electrical grid 300 in order to control grid 300 and/or to provide information to operators thereof. Forecasting system 100 may comprise various processors, software programs, computing components, and/or the like. Forecasting system 100 may be operable to execute various exemplary forecasting methods, for example method 800 as disclosed in FIG. 8.

The increasing penetration level of wind power generation renders significant operational challenges, due to the non-dispatchability and variability of wind generation. Wind ramps make reliable system operations more challenging, since existing forecast approaches fail to capture abrupt large changes of wind ramps. Therefore, at a high penetration level of wind generation, in order to achieve reliable system operations it is desirable to accurately detect and forecast wind ramps.

While the power industry does not currently utilize any one standard mathematical definition of wind ramp events, in general, wind ramps are typically defined mathematically following the property of identifying large positive or negative swings in wind power output within a short time window. In this disclosure, a ramp rate threshold rule is utilized, as follows:

Let $\Delta P_{ag}(t) = P_{ag}(t) - P_{ag}(t-1)$ denote the difference between two consecutive wind power generation levels. A ramp event occurs, if $|\Delta P_{ag}(t)| > P_{th}$, where $P_{th}$ is a certain threshold, for example a threshold specified by a system operator. A positive value of $\Delta P_{ag}(t)$ indicates a ramp up event, and a negative value of $\Delta P_{ag}(t)$ represents a ramp down event.

Due to wind ramps, short-term wind power forecasts have significant uncertainty, which then leads to distributional forecasts to attempt to manage uncertainty. One of the key advantages of distributional forecasts is that they enable system operators to maintain an acceptable level of risk. Stochastic scheduling of power systems based on distributional forecasts can improve the system efficiency, in terms of reducing system reserve.

In accordance with an exemplary embodiment, a Markov chain-based short-term wind power forecast may be developed by using a spatio-temporal analysis approach. Operational wind farm measurement data show that the power outputs of wind turbines within the same wind farm can be quite different, even if the wind turbines are of the same class and physically located close to each other. A graphical model to capture the spatial correlation between the power outputs from the wind turbines may be developed, i.e., a minimum spanning tree may be constructed based on graph theory. In one exemplary embodiment, the spatial correlation between the individual wind turbines in each class $C_m$ is determined by using a linear regression model, i.e., $$P_{i_m}(t) = a_m^{d_{i_m}} P_{r_m}(t),$$

where $P_{i_m}(t)$ is the power output of wind turbine $i_m$ in class $C_m$, $P_{i_m}(t)$ is the power output of root wind turbine $i_m$ in the minimum spanning tree of class $C_m$, $d_{i_m}$ is the distance (the number of hops) between turbine $i_m$ and root turbine $r_m$, and $a_m$ is a coefficient determined by the minimum mean square error (MMSE) principle as follows:

$$\alpha_m = \underset{\alpha}{\operatorname{argmin}} \frac{1}{N_i} \sum_i \left( P_{ag,m}(t) - \sum_{i_m \in C_m} \alpha^{d_{i_m}} P_{r_m}(t) \right)^2, \quad \text{(Equation 1)}$$

where $N_t$ is the number of measurement data, and $P_{ag,m}(t)$ is the aggregate power output of class $C_m$.

Based on Equation 1 and the power curve $U_m(\bullet)$ of each class $C_m$, the aggregate power output of a wind farm $P_{ag}(t)$ can be characterized by using the wind speed $W_{\overline{m}}(t)$ measured at a reference meteorological tower (MET) $\overline{m}$ as follows (2)

$$P_{ag}(t) = \sum_m P_{ag,m}(t) \quad \text{(Equation 2)}$$

$$= \sum_m \sum_{i_m \in C_m} \alpha_m^{d_{i_m}} U_m(\beta_m W_{\overline{m}}(t))$$

$$\triangleq G_{pw}(W_{\overline{m}}(t)),$$

where $\beta_m$ is the correlation between the wind speed of the root wind turbine of class $C_m$ and the reference MET $\overline{m}$, which can be obtained using the MMSE principle similarly as in Equation 1. Therefore, the cumulative density function $F_{P_{ag}}$ of wind farm aggregate wind power generation can be obtained from the cumulative density function of $W_{\overline{m}}(t)$, i.e., $F_{P_{ag}}(\bullet) = F_{w_{\overline{m}}}(G_{pw}^{-1}(\bullet))$.

In an exemplary embodiment, a temporal correlation may be analyzed by using a finite state Markov chain model. A central step is to capture the statistical distribution and temporal dynamics of aggregate wind farm generation $P_{ag}(t)$ during each epoch using a Markov chain with the following characteristics:

The Markov chain has $N_s$ ($N_s$ is finite) states. Let S denote the state space of the Markov chain. Specifically, state $S_k = [\Gamma_k, \Gamma_{k+1})$, $k \in \{1, \ldots, N_s\}$, corresponds to a specific range of generation levels with extreme values given by $\Gamma_1 = 0$ and $\Gamma_{N_s} + 1 = P_{ag}^{max}$; and, the Markov chain is discrete-time and of order 1. By utilizing this exemplary approach, the resulting Markov chains are made practical for forecasting applications; stated another way, the resulting forecast is made based on recent data.

In an exemplary embodiment, an objective of the Markov chain design is to determine the generation levels $\Gamma_k$ ($k=1, \ldots, N_s+1$) that define the states, the transition matrix Q, and the representative generation level $P_{ag,k}$ for each state k. A state space may be designed as follows: Define the quantity $\tau_k$ as the average duration that $P_{ag}$ stays in state $S_k$, $$\tau_k = \frac{F_{P_{ag}}(\Gamma_{k+1}) - F_{P_{ag}}(\Gamma_k)}{\mathcal{N}(\Gamma_k) + \mathcal{N}(\Gamma_{k+1})}, \quad \text{(Equation 3)}$$

where $\mathcal{N}(\Gamma)$ denotes the level crossing rate (the number of times per unit time that the wind farm aggregate power process $P_w$ crosses $\Gamma$) for the farm aggregate power $\Gamma$ ($\Gamma \geq 0$).

A constant $\tau$ may be introduced to find the $N_s - 1$ variables $\{\Gamma_2, \Gamma_3, \ldots, \Gamma_{N_s}\}$, i.e., solving Equation 3 with $\tau_k = \tau$, $\forall k \in \{1, \ldots, N_s - 1\}$. Then, the transition probability matrix may be obtained by using the resulting data, as follows:

$$[Q]_{i,j} = \frac{n_{ij}}{\sum_{k=1}^{N_s} n_{ik}}, \quad \text{(Equation 4)}$$

where $n_{ij}$ is the number of transitions from $S_i$ to $S_j$. Accordingly, the representative generation level for each state $S_k$ can be obtained by $$P_{ag,k} = \frac{\int_{\Gamma_k}^{\Gamma_{k+1}} x f_{P_{ag}}(x) dx}{F_{P_{ag}}(\Gamma_{k+1}) - F_{P_{ag}}(\Gamma_k)}, \quad \text{(Equation 5)}$$

where $f_{P_{ag}}(\bullet)$ is the probability density function of $P_{ag}$.

In various exemplary embodiments, due to the diurnal non-stationarity and the seasonality of wind speed, the Markov chain is non-stationary. Moreover, the seasonality of wind speed may be addressed by designing a forecast model for a selected limited time interval, for example a forecast model for an individual month, an individual week, and so forth. Additionally, the diurnal non-stationarity may be addressed by identifying an epoch such that the wind generation exhibits essentially stationary behavior within every such epoch, and designing a forecast model for each of these epochs separately. In one exemplary embodiment, an epoch of three hours is utilized. In another exemplary embodiment, an epoch of two hours is utilized. However, any suitable epoch may be utilized, as desired.

Figure 2A:
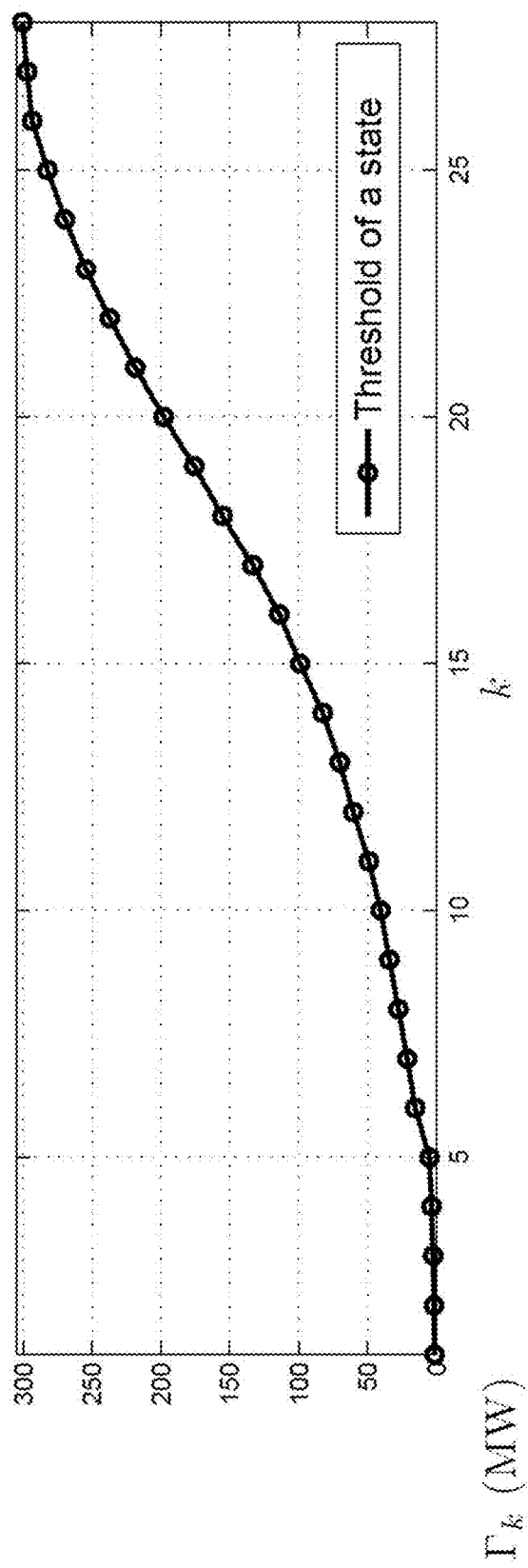
FIG. 2A illustrates an exemplary state space for use in connection with forecasting wind farm power generation in accordance with an exemplary embodiment.
Figure 2B:
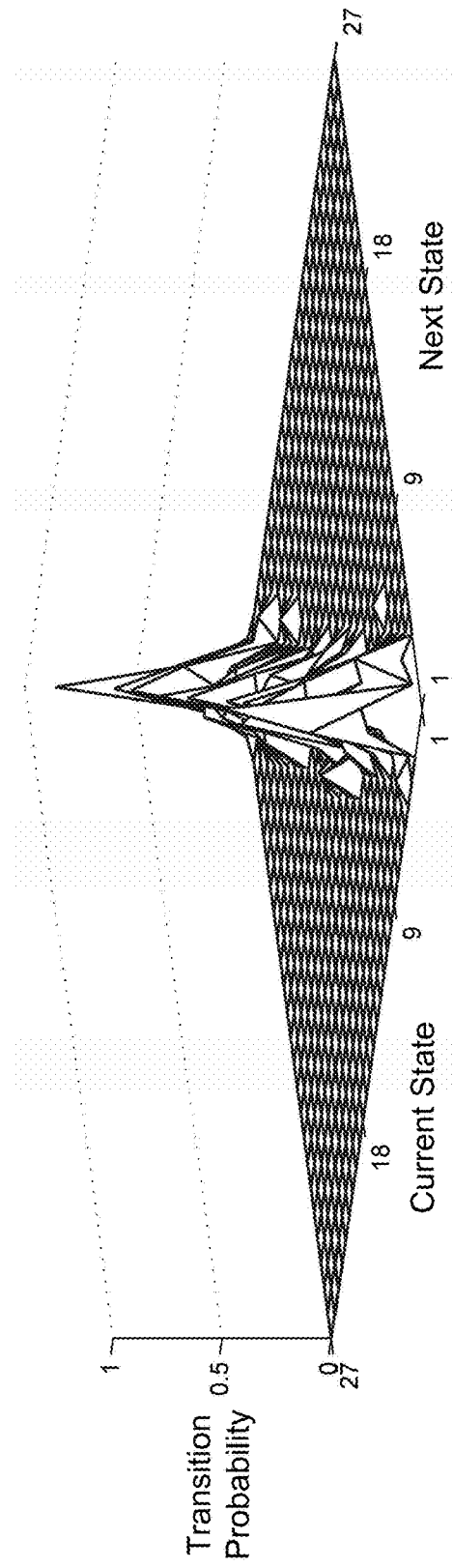
FIG. 2B illustrates a transition matrix corresponding to the state space of FIG. 2A in accordance with an exemplary embodiment.

With reference now to FIGS. 2A and 2B, in accordance with an exemplary embodiment, illustrated is a designed state space S and the corresponding transition matrix, obtained by choosing $\tau = 2$ mins for an exemplary 9 AM-noon epoch in January.

Figure 3:
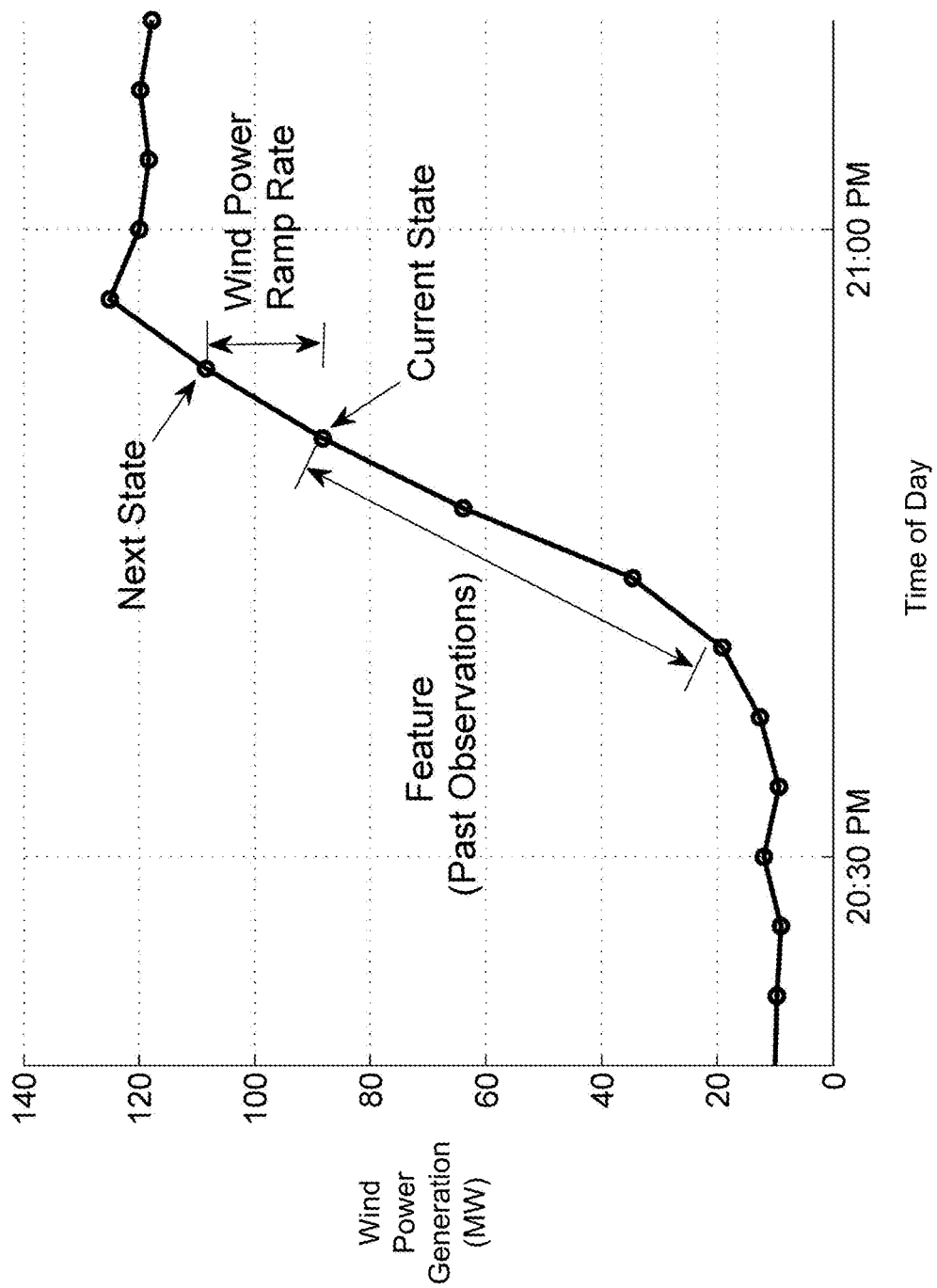
FIG. 3 illustrates strong correlation between past observation and wind power ramp rate in accordance with an exemplary embodiment.

However, a Markov chain model is unable to capture the dynamics of wind ramps, as illustrated in FIGS. 2A and 2B. This is because the random process of wind generation is more likely to switch out of the current state to some faraway state in the presence of wind ramps, which cannot be captured by a transition matrix that focuses on only the transition between neighboring states. As previously noted, without an accurate wind ramp forecast, a large amount of reserves may be required to ensure system reliability. Note that the Markov chain model forecasts the wind generation by using only the previous state. However, historical metereological and power generation records reveal that wind ramps occur with specific patterns. FIG. 3 illustrates an exemplary pattern when a wind ramp-up event occurs. The observed pattern can be utilized to forecast future wind ramps. In accordance with principles of the present disclosure, support vector machines (SVMs) may be used to forecast wind ramps based on specific patterns present in historical data.

SVMs may be utilized to forecast wind ramps based on their specific patterns (past observations), for example as illustrated in FIG. 3. In a SVM, the past observations may be referred to as "features", while the state in the next time slot may be referred to as a "class". In an exemplary embodiment, a feature is mapped into a higher-dimensional feature space via a nonlinear mapping, based on which a SVM classifier predicts its class, i.e., predicts a wind power ramp. In these embodiments, the method aims to solve the classifier based on historical data. Note that due to the diurnal non-stationarity and the seasonality of wind farm generation, for each state in each Markov chain, at least one SVM classifier is developed.

Since the number of wind power ramp classes is more than two, a multi-class classifier is suitable. In an exemplary embodiment, a one-against-all method may be used to construct multiple binary SVM classifiers, with the jth one separating class j from all the remaining classes. Note that the number of wind power ramp rates may be different for each state in each Markov chain, due to the diurnal non-stationarity and the seasonality of wind farm generation. In an exemplary forecasting model, $M_k$ may be the number of wind power ramp classes at state $S_k$ and $R_j^k$ may be the wind power ramp rate of the jth class. Here the index for each Markov chain is omitted for notational simplicity. Note that since the Markov chains are non-stationary, multiple SVM classifiers are actually developed for each Markov chain. Specifically, for each state $S_k$, let $\{x_1, y_1\}, \ldots, \{x_{N_k}, y_{N_k}\}$ be $N_k$ training samples, where $x_i \in \mathbb{R}^l$ is an l-dimensional feature vector (l observations) and $y_i \in \{1, \ldots, M_k\}$ is the corresponding class label. In the exemplary one-against-all method, the jth SVM is trained, for example with all the training samples of the jth class with positive labels, and the others with negative labels, which leads to solve the following quadratic optimization problem that yields the jth decision function $f_j(x) = w_j^T \phi(x) + b_j$, where $w_j \in \mathbb{R}^l$, $b_j$ is a scalar, and $\phi(x)$ maps x into a higher-dimensional space. In other words, in an exemplary forecasting approach, we $$\text{minimize} \quad \frac{1}{2} w_j^T w_j + \gamma_j \sum_{i=1}^{N_k} \xi_i^j \qquad \text{(Equation 6)}$$

$$\text{subject to} \quad \tilde{y}_i(w_j^T \phi(x_i) + b_j) \geq 1 - \xi_i^j,$$

$$\xi_i^j \geq 0, i = 1, \ldots, N_k,$$

$$\text{variables} \quad \{w_j, b, \xi^j\},$$

where $\tilde{y}_i = 1$ if $y_i = j$ and $\tilde{y}_i = -1$ otherwise, and $\gamma_j > 0$ is the regularization parameter.

In an exemplary embodiment, at the classification phase, a sample x is classified as in class $j^*$, if $f_{j^*}(x)$ produces the largest value $$j^* = \operatorname*{argmax}_{j=1,\ldots,M_k} f_j(x) = \operatorname*{argmax}_{j=1,\ldots,M_k} (w_j^T \phi(x) + b_j). \qquad \text{(Equation 7)}$$

Accordingly, a forecast of the wind farm generation by using a SVM is $$\hat{P}_{ag}^{SVM}(t+1) = P_{ag}|(t) + R_{j^*}^k, \qquad \text{(Equation 8)}$$

where $P_{ag}(t) \in [\Gamma_k, \Gamma_{k+1})$ is the current observed wind farm power generation. The corresponding forecast state $S_{\hat{k}}$ is the state satisfying $\hat{P}_{ag}^{SVM}(t+1) \in [\Gamma_{\hat{k}}, \Gamma_{\hat{k}+1})$.

In an exemplary embodiment, a SVM-enhanced Markov model may be developed by integrating the SVM model into the Markov chain model. Specifically, the estimated forecast accuracy of the SVM model may be used as the transition probability from the current state to the forecast state $S_{\hat{k}}$ given by Equation 8, which can be obtained by using a cross-validation approach. In a cross-validation approach, the training set is divided into v subsets of equal size. Sequentially, one subset is tested using the classifier trained on the remaining v−1 subsets. Thus, each instance of the whole training set is predicted once, so the cross-validation accuracy is the percentage of data which are correctly classified. Accordingly, let $q_k$ denote the transition probability from the current state $S_k$ to the forecast state $S_{\hat{k}}$ given by Equation 8. The distributional forecast is given by $$Pr(P_{ag}(t+1) = P_{ag,j} \mid S(t) \qquad \text{(Equation 9)}$$
$$= S_k, x(t))$$
$$= \begin{cases} q_k; & \text{if } j = \hat{k}; \\ (1 - q_k) \dfrac{Q_{kj}}{\sum_{l \neq \hat{k}} Q_{kl}}, & \text{otherwise,} \end{cases}$$

where S(t) is the state of the Markov chain at time t and $x(t) \in \mathbb{R}^l$ is the observations at time t. Note that the forecast state $S_{\hat{k}}$ is time-variant, depending on the observations x(t) at time t. In other words, the SVM enhanced Markov chain is time-variant, and is thus potentially suitable to capture wind ramp dynamics.

From the distributional forecast illustrated in Equation 9, a point forecast can be given by $$\hat{P}_{ag}(t+1) = P_{ag,\hat{k}} q_k + \sum_{j \neq \hat{k}} P_{ag,j}(1 - q_k) \dfrac{Q_{kj}}{\sum_{l \neq \hat{k}} Q_{kl}} \qquad \text{(Equation 10)}$$

which is the conditional mean of an SVM-enhanced Markov chain conditioned on the current state S(t) and the observations x(t).

It can be seen that, in accordance with various exemplary embodiments, a forecasting approach utilizing Equation 9 and Equation 10 can capture the wind power ramp dynamics by using a hybrid model based on Markov chains and SVM. When wind ramp events occur, $P_{ag,\hat{k}} q_k$ captures the transition from the current state to some faraway state and closely tracks the dynamics of wind farm power generation.

In addition to offering improved forecast accuracy, exemplary forecasting approaches as disclosed above may be implemented in parallel when computing the state space and the transition matrix of each Markov chain, since each of the Markov chains are obtained based on data in different epoches and months, in order to take into account the diurnal non-stationarity and the seasonality of wind farm generation. After obtaining the Markov chains, the SVM classifiers can also be computed in parallel, because there are no couplings between different SVM classifiers. Therefore, the Markov chains and the SVM classifiers can be obtained in a computationally efficient and rapid manner.

In accordance with various exemplary embodiments, forecasting approaches as disclosed herein were validated against data obtained from an operational wind farm with a rated capacity of $P_{ag}^{max} = 300.5$ MW. There are two classes of wind turbines in this wind farm, one class with 53 turbines and the other with 221 turbines. For each class $C_m$, a meteorological tower (MET) is deployed and co-located with a wind turbine, i.e., the root turbine $r_m$. The power outputs of all wind turbines and the wind speeds measured at all METs were recorded every 10 minutes for the years 2009 and 2010. To validate the exemplary approaches, the data of year 2009 was used to train the Markov chains and the SVM classifiers, and the data of year 2010 was used to evaluate the forecast accuracy of the exemplary approaches disclosed herein. In an exemplary embodiment, the SVM classifiers may be trained by using the LIBSVM toolbox or other suitable approach.

Training a SVM

Kernel Function:

In the SVM, the mapping function $\phi(x)$ can be implicitly defined by introducing the so-called kernel function $K(x_{i_1}, x_{i_2})$, which computes the inner product of vectors $\phi(x_{i_1})$ and $\phi(x_{i_2})$. In an exemplary embodiment, a radial basis function is used, $$K(x_{i_1}, x_{i_2}) = \exp\left(-\dfrac{\|x_{i_1} - x_{i_2}\|^2}{\sigma_j^2}\right), \qquad \text{(Equation 11)}$$

where $\sigma_j^2$ is a predetermined parameter and may be different across different classifiers.

Feature Selection:

In various exemplary embodiments, the dimension l of the feature vector x plays a central role in determining the performance of a wind power forecast. Improper selection of the feature dimension can lead to poor classification in the SVM. If the feature dimension, i.e., the number of previous data samples used as the input of the SVM, is too high, prior conditions unrelated to current conditions may reduce the classification accuracy. In contrast, if the feature dimension is low, the features may not capture the characteristics of wind power ramp events.

In various exemplary embodiments, the dimension l may be determined by exhaustive search. Specifically, given l, we first determine the parameters $\gamma_j$ and $\sigma_j^2$ of the SVM, for example based on a grid-search approach. The basic idea of the grid-search approach is to select $\gamma_j$ and $\sigma_j^2$ from a grid that is formed by exponentially growing sequences of $\gamma_j$ and $\sigma_j^2$ (for example, $\gamma_j = 2^{-5}, 2^{-3}, \ldots, 2^{15}$ and $\sigma_j^2 = 2^{-15}, 2^{-13}, \ldots, 2^3$). Then we compare the point forecast errors given by different values of l, and select l with the lowest point forecast error. In an exemplary embodiment, the forecast error is quantified by mean absolute error (MAE), $$MAE = \frac{1}{N_t} \sum_t |P_{ag}(t) - \hat{P}_{ag}(t)|, \quad \text{(Equation 12)}$$

and standard deviation (Std), $$Std = \sqrt{\frac{1}{N_t} \sum_t (|P_{ag}(t) - \hat{P}_{ag}(t)| - MAE)^2}. \quad \text{(Equation 13)}$$

Figure 4:
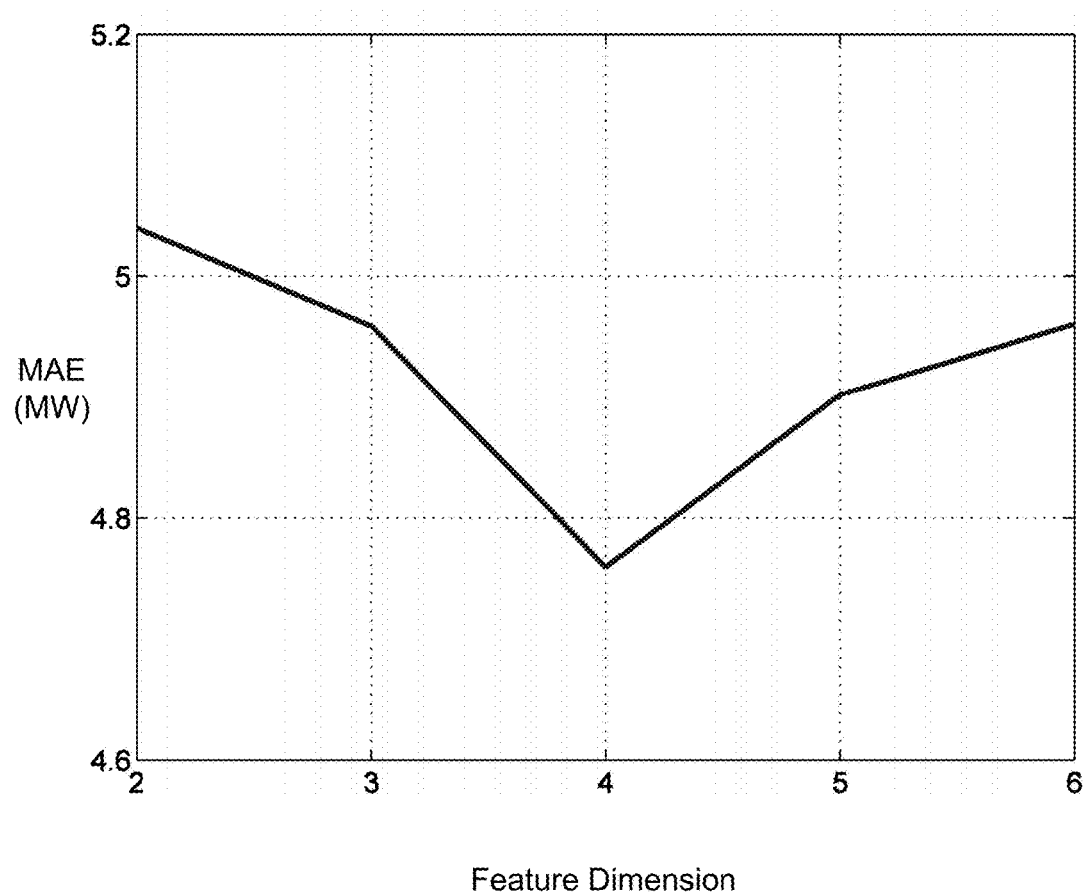
FIG. 4 illustrates performance of various feature depth (historical data) approaches in connection with forecasting wind farm power generation in accordance with an exemplary embodiment.

With reference now to FIG. 4, in accordance with principles of the present disclosure MAE is illustrated as a function of the length of the feature dimension (the length of the training data) by using exemplary historical data from a wind farm for the month of January 2010. It will be appreciated that different wind farms may utilize predictions based on differing lengths of the feature dimension, as suitable, in order to obtain a forecast with minimized error. As shown in FIG. 4, the feature dimension l plays a key role in determining the performance of wind forecast. When considering this exemplary historical data, the MAE decreases drastically with the increase of the feature dimension up to l=4 and increases thereafter. Therefore, l=4 is utilized as the feature dimension in the following exemplary explanations.

In an exemplary validation test, a forecasting approach as disclosed herein is applied to the measurement data from January 2009. As a result, 8 Markov chains are obtained, each for a 3-hour epoch. For each state in each Markov chain, a multi-class classifier is constructed by using the one-against-all method and the SVM parameters discussed above. Thereafter, the corresponding measurement data from January 2010 is used to test the disclosed forecast approach for wind power ramp rates, as follows:

Point Forecasts:

We compare the forecast errors of the disclosed methods with two prior point forecast approaches, when wind ramp events occur:

Prior approach 1: a persistence forecast: $\hat{P}_{ag}(t+1) = P_{ag}(t)$.
Prior approach 2: a forecast with only a Markov chain model without using a SVM model, i.e., setting $q_k = 0, \forall k$.

Figure 5A:
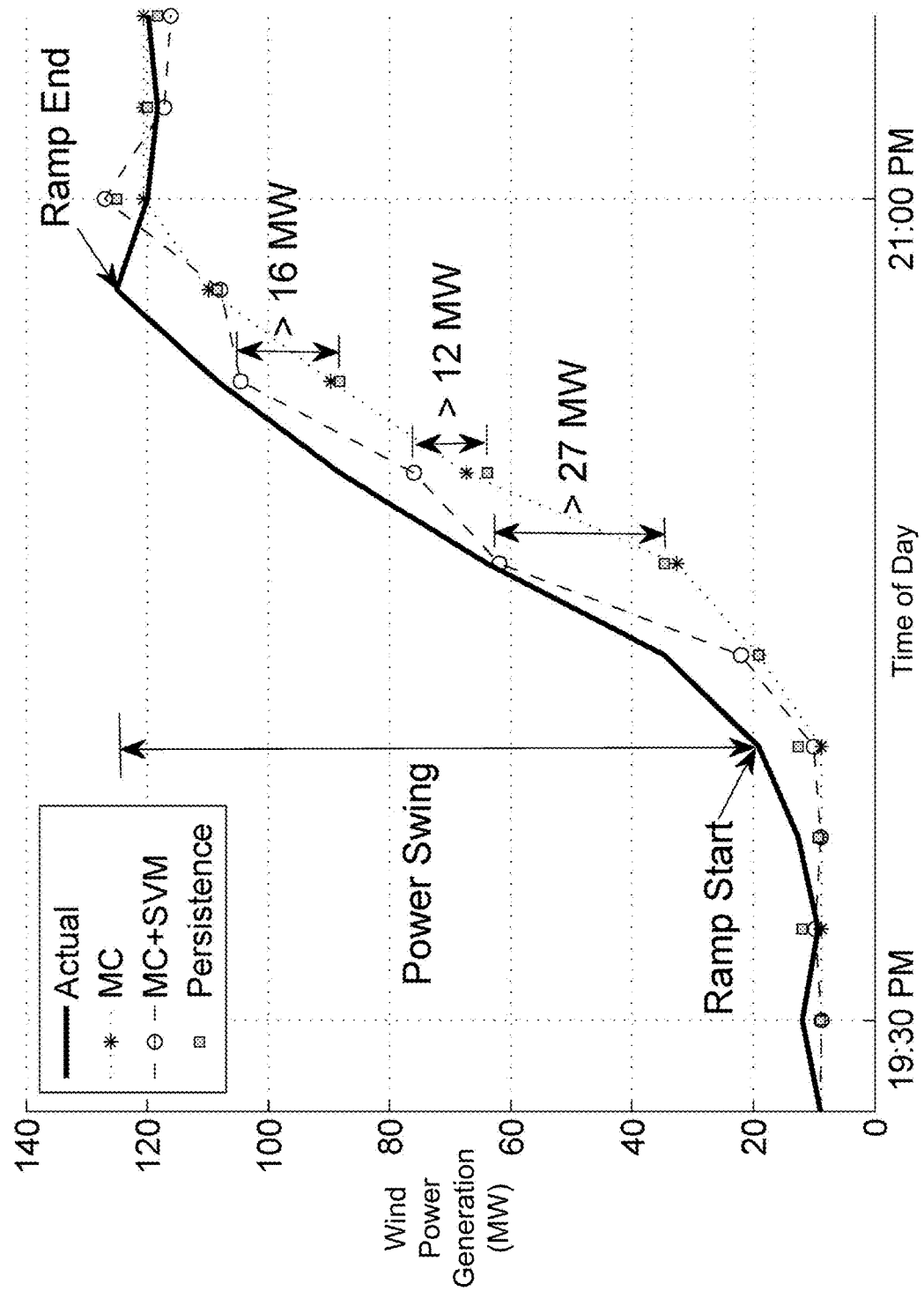
FIGS. 5A and 5B illustrate performance of various forecast approaches in the presence of wind ramp events in accordance with an exemplary embodiment.
Figure 5B:
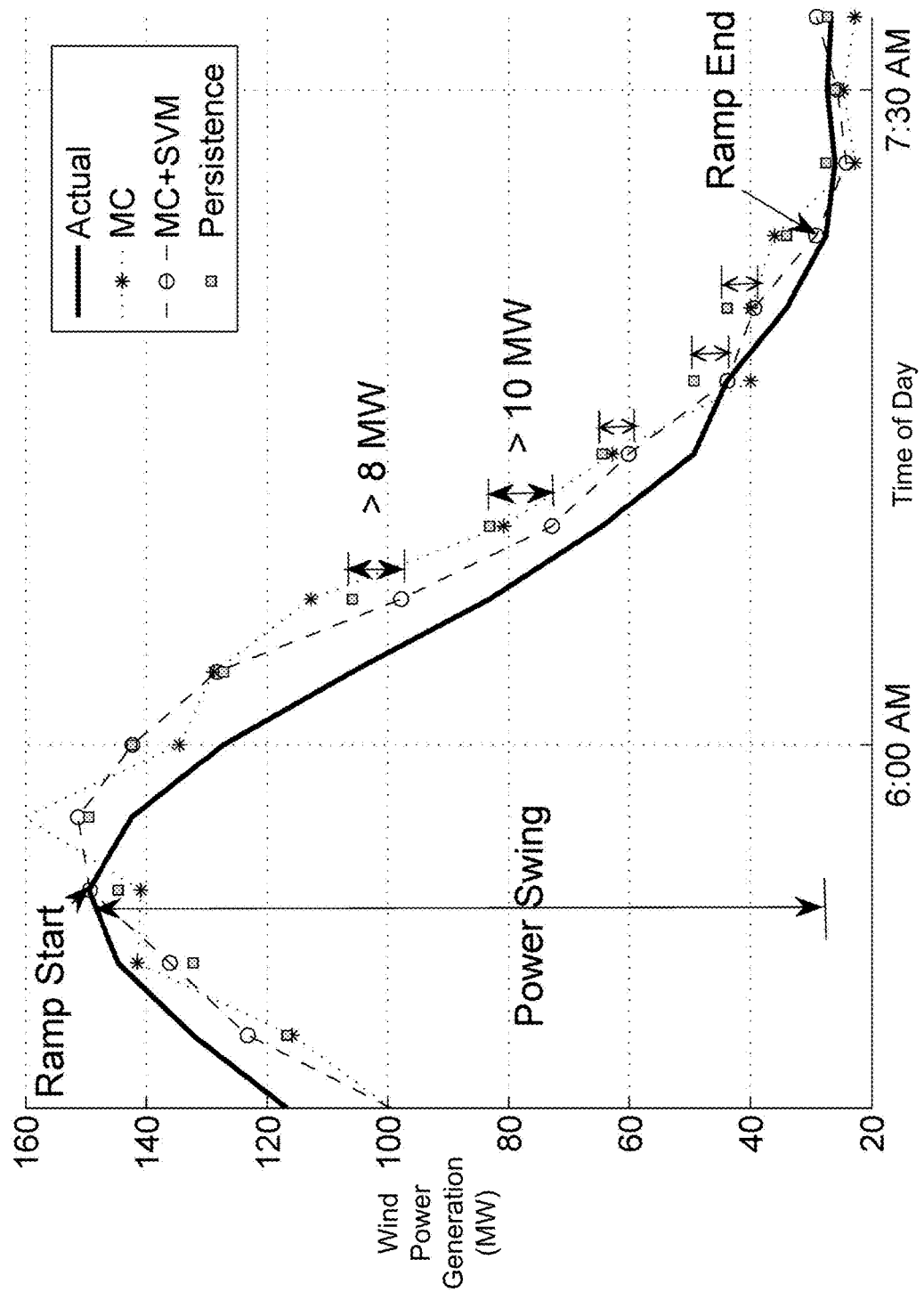

FIGS. 5A and 5B compare the performance of different forecast approaches in the presence of wind ramp events. Data from Jan. 30, 2010 is chosen for illustration, where the wind power ramp rates (power swing) are more than 100 MW in the selected time window. As illustrated in FIGS. 5A and 5B, an exemplary forecasting approach as disclosed herein (based on the Markov chain model and the SVM model) exhibits significant forecast improvement over prior approach 1 (the persistence forecast) and prior approach 2 (the forecast with only the Markov chain model). In terms of the maximum improvement, the exemplary method yields more than 27 MW improvement over the other forecasts for the ramp up event and 10 MW for the ramp down event. This is because the exemplary method can capture the wind ramp dynamics, i.e., wind power ramps are captured in the transition matrix (Equation 9) by using the SVM.

TABLE 1

Comparison of forecast approaches as applied to actual wind farm data from Jan. 30, 2010.

| Ramp Event | Error | Prior Approach 1: Persistence | Prior Approach 2: Markov Chain | Exemplary Approach: MC + SVM |
|---|---|---|---|---|
| Ramp UP | MAE | 18.74 MW | 18.65 MW | 9.5 MW |
|  | Std | 7.87 MW | 7.18 MW | 5.72 MW |
|  | Maximum | 29.29 MW | 31.34 MW | 17.12 MW |
|  | Minimum | 6.52 MW | 10.31 MW | 2.03 MW |
| Ramp DOWN | MAE | 12.69 MW | 13.44 MW | 8.73 MW |
|  | Std | 6.77 MW | 8.24 MW | 7.27 MW |
|  | Maximum | 22.79 MW | 29.61 MW | 22.33 MW |
|  | Minimum | 4.94 MW | 3.89 MW | 0.07 MW |

TABLE 2

Comparison of forecast approaches as applied to actual wind farm data from January 2010.

| Error | Prior Approach 1: Persistence | Prior Approach 2: Markov Chain | Exemplary Approach: MC + SVM |
|---|---|---|---|
| MAE | 16.52 MW | 15.56 MW | 13.88 MW |
| Std | 6.16 MW | 7.66 MW | 6.88 MW |
| Maximum | 55.32 MW | 51.62 MW | 44.75 MW |
| Minimum | 10.01 MW | 0.20 MW | 0.03 MW |

A detailed comparison of forecast approaches is given in Table I. It is observed from Table I that for the ramp up event, an exemplary method yields more than 49% improvement over the persistence and Markov chain forecasts, and for the ramp down event, an exemplary method yields 31% and 35% improvement over the persistence and Markov chain forecasts, respectively.

Table II compares the performance of different forecast approaches in the presence of wind ramp events in January 2010. In this comparison, the slots with the ramp rate more than 10 MW per slot are chosen to calculate the forecast errors of different forecast approaches. From Table II in terms of MAE, an exemplary method can yield 16% and 11% improvement over the persistence forecast and the forecast with only the Markov chain model, respectively. Accordingly, by using the exemplary forecasting methods disclosed herein, utilities and system operators can operate more efficiently and with reduced costs.

Distributional Forecasts.

Figure 6A:
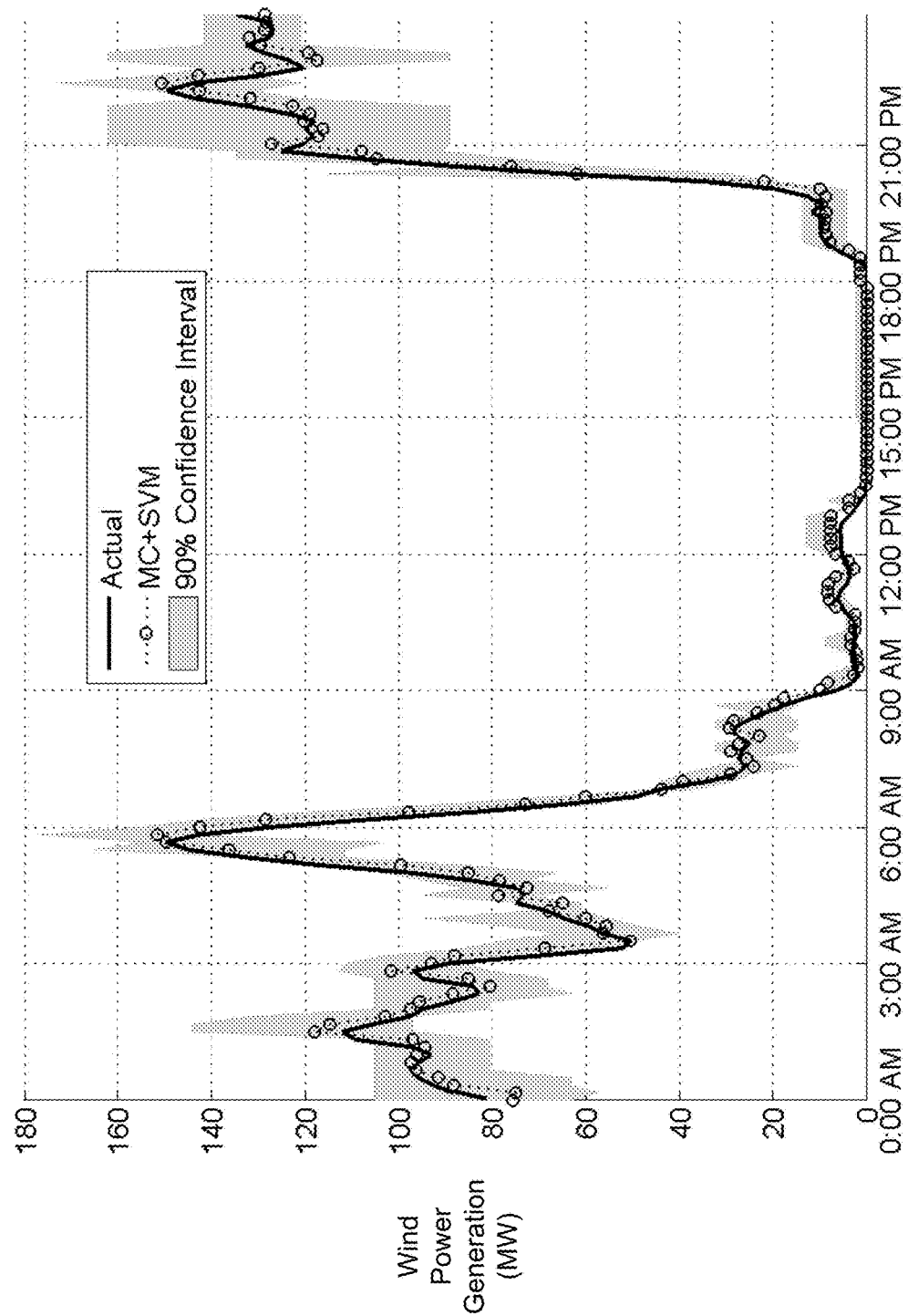
FIGS. 6A and 6B illustrate distributional forecasts of wind farm power generation in accordance with an exemplary embodiment.
Figure 6B:
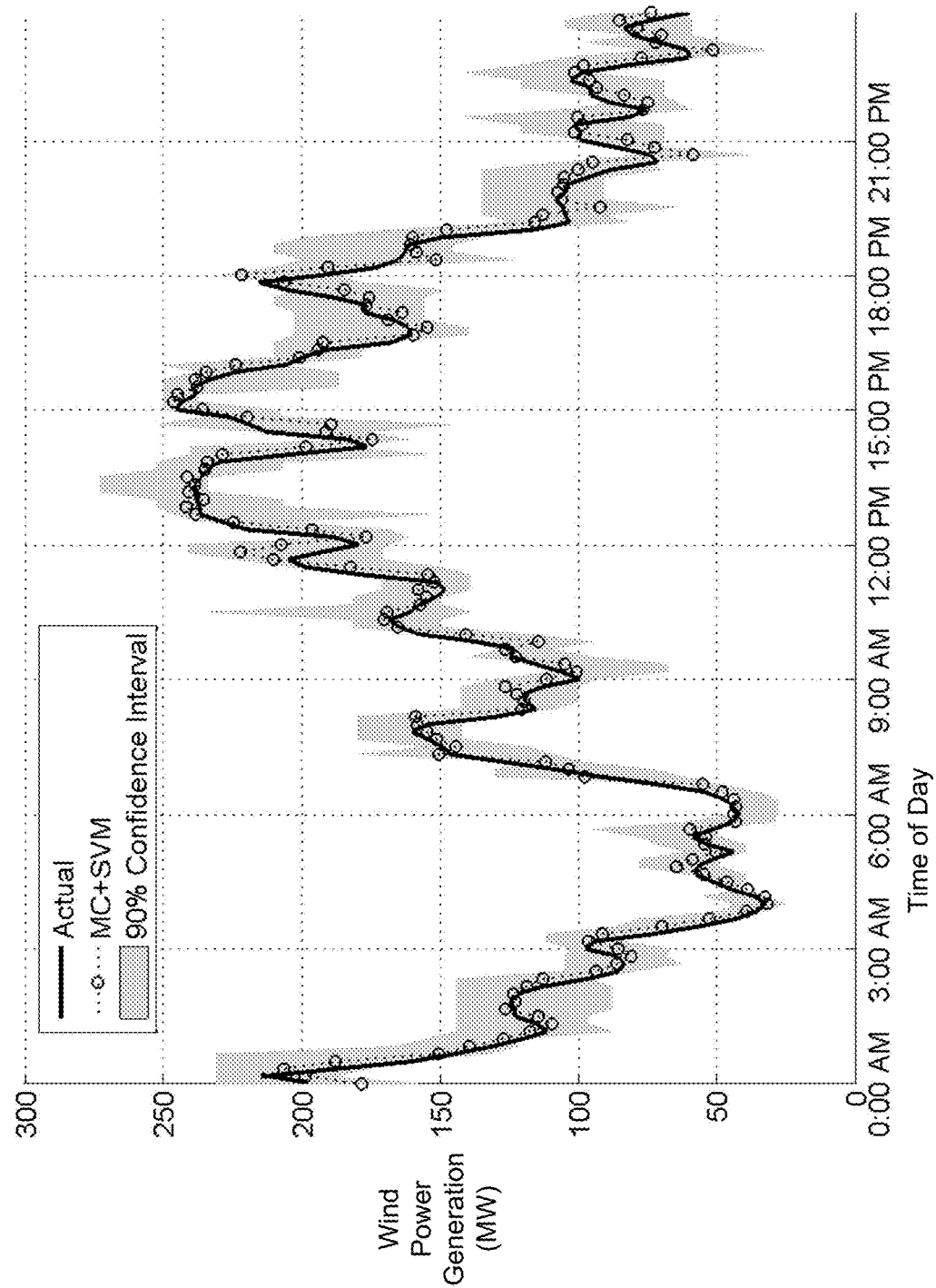

Turning now to FIGS. 6A and 6B, exemplary distributional forecasts of wind farm power generation are illustrated, and the point forecasts and the corresponding 90% confidence interval are provided. Jan. 30, 2010 is chosen for illustration in FIG. 6A, in which the wind power ramp rates (power swing) are more than 100 MW. Another extreme day, Jan. 23, 2010, is chosen for illustration in FIG. 6B, in which the wind power fluctuates significantly with a highest average ramp rate of 15.44 MW per slot. As illustrated in FIGS. 6A and 6B, the actual wind farm generation lies in a reasonable range of the confidence interval obtained from the distributional forecast arising from the exemplary methods, despite the sharp ramps.

Figure 7A:
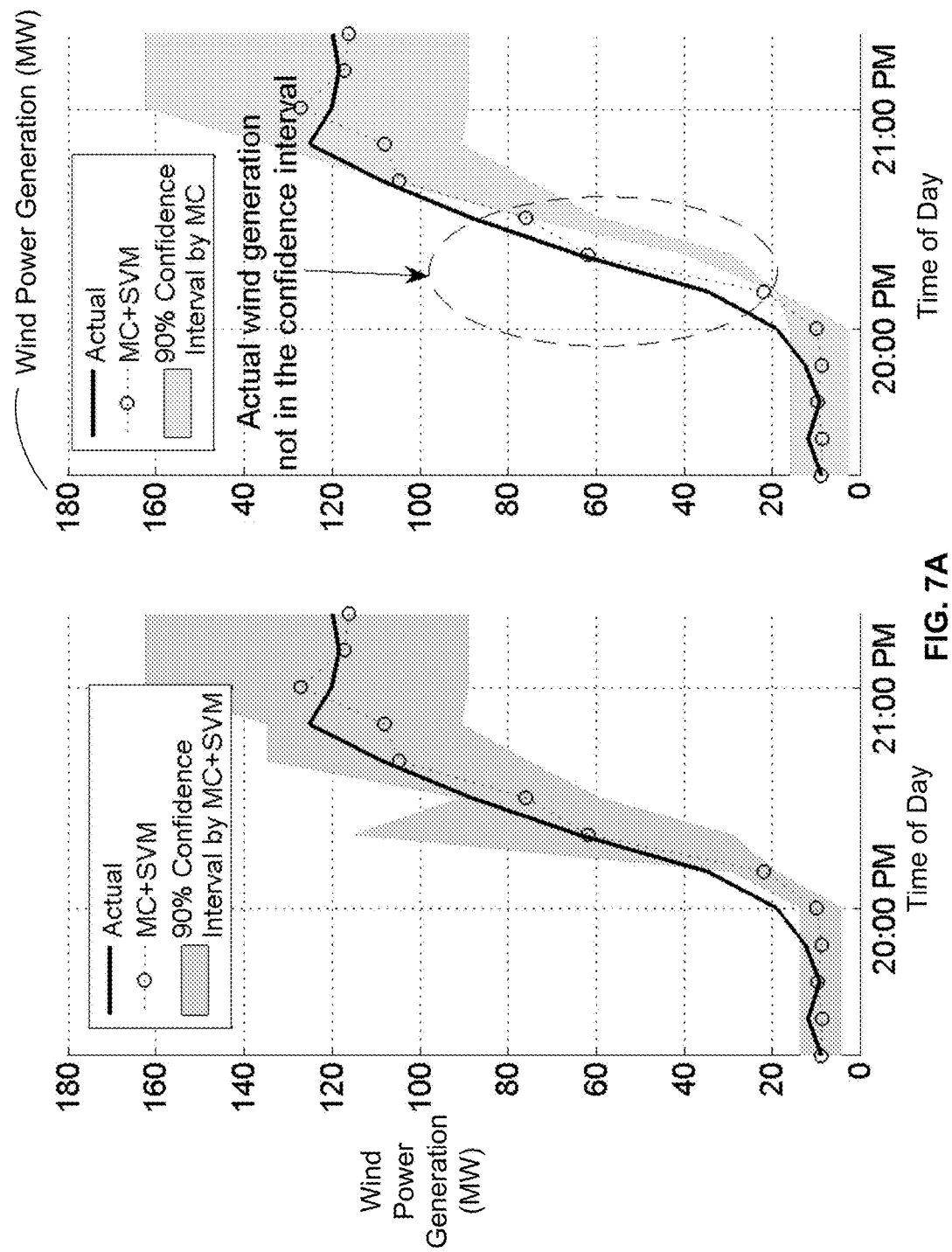
FIGS. 7A and 7B illustrate distributional forecasts of wind farm power generation in accordance with an exemplary embodiment, illustrating predictive improvements over prior approaches.
Figure 7B:
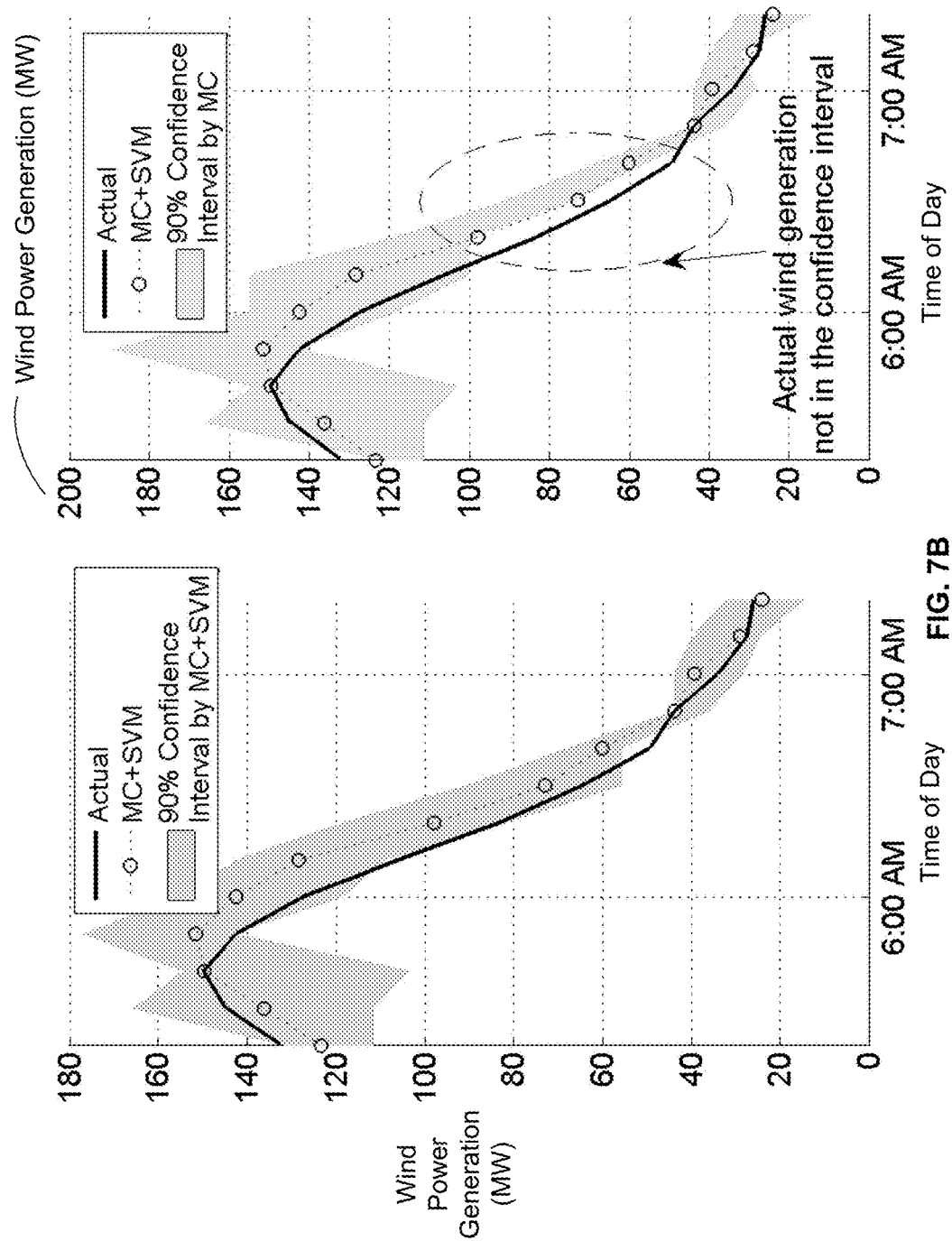

In contrast, if a prior approach lacking a SVM model is employed, the 90% confidence interval may not cover the actual wind farm generation as illustrated in FIGS. 7A and 7B. In FIGS. 7A and 7B, Jan. 30, 2010 is chosen for illustration, in which the confidence interval obtained from the distributional forecast of an exemplary method is compared with that obtained by using the Markov chain model only. It can be seen that the actual data may lie outside the confidence interval for the prior approach; stated another way, the prior approach is of limited predictive value in the presence of wind ramps. When wind ramp events (especially with large ramp rates) occur, an exemplary method can capture the transition from the current state to some faraway state and therefore provide better confidence intervals.

Figure 8:
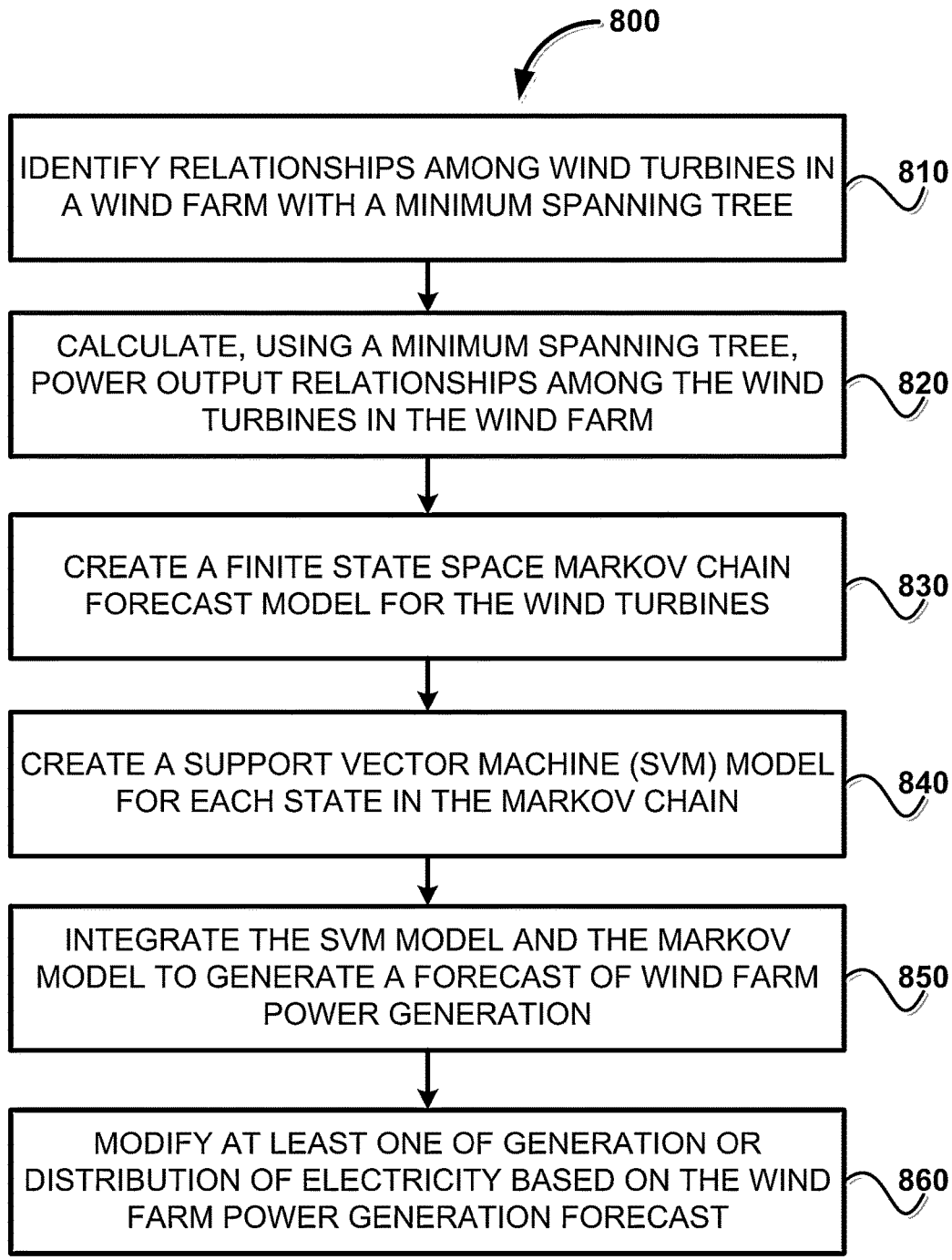
FIG. 8 illustrates a method for forecasting wind farm power generation in accordance with an exemplary embodiment.

Turning now to FIG. 8, in an exemplary embodiment, a method 800 for forecasting wind power generation in a wind farm comprises identifying relationships among wind turbines in the wind farm using minimum spanning trees (step 810); calculating, using the minimum spanning trees, power output relationships among the wind turbines (step 820); creating a finite state space Markov chain forecast model for the wind turbines in the wind farm (step 830); creating a support vector machine (SVM) model for each state in the Markov chain (step 840); integrating the SVM model into the Markov model to generate a forecast of the wind farm power generation (step 850); and modifying at least one of a generation of electricity or a distribution of electricity based on the predicted power output of the wind farm (step 860).

The present disclosure has been described with reference to various embodiments. However, one of ordinary skill in the art appreciates that various modifications and changes can be made without departing from the scope of the present disclosure. Accordingly, the specification is to be regarded in an illustrative rather than a restrictive sense, and all such modifications are intended to be included within the scope of the present disclosure. Likewise, benefits, other advantages, and solutions to problems have been described above with regard to various embodiments. However, benefits, advantages, solutions to problems, and any element(s) that may cause any benefit, advantage, or solution to occur or become more pronounced are not to be construed as a critical, required, or essential feature or element of any or all the claims.

As used herein, the meaning of the term "non-transitory computer-readable medium" should be construed to exclude only those types of transitory computer-readable media which were found in In re Nuijten, 500 F.3d 1346 (Fed. Cir. 2007) to fall outside the scope of patentable subject matter under 35 U.S.C. § 101, so long as and to the extent In re Nuijten remains binding authority in the U.S. federal courts and is not overruled by a future case or statute. Stated another way, the term "computer-readable medium" should be construed in a manner that is as broad as legally permissible.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of embodiments encompassed by this disclosure. The scope of the claimed matter in the disclosure is accordingly to be limited by nothing other than the appended claims, in which reference to an element in the singular is not intended to mean "one and only one" unless explicitly so stated, but rather "one or more."

Systems, methods and apparatus are provided herein. In the detailed description herein, references to "various embodiments", "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. § 112(f), unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

When language similar to "at least one of A, B, or C" or "at least one of A, B, and D" is used in the claims, the phrase is intended to mean any of the following: (1) at least one of A; (2) at least one of B; (3) at least one of C; (4) at least one of A and at least one of B; (5) at least one of B and at least one of C; (6) at least one of A and at least one of C; or (7) at least one of A, at least one of B, and at least one of C.

What is claimed is:

1. A method for improving the operation of a fossil fuel power plant, the method comprising:
deploying a meteorological tower at a location co-located with a wind turbine in a wind farm, wherein the wind farm comprises a plurality of wind turbines, wherein the wind farm is coupled to an electrical grid, and wherein the fossil fuel power plant is coupled to the electrical grid;
transmitting from the meteorological tower and to a processor for forecasting wind farm power, wind speed information associated with the wind turbine;

receiving, at the processor and from a wind farm power generation sensor coupled to the wind farm, power generation information for the wind farm;

identifying, by the processor, relationships among the wind turbines in the wind farm using minimum spanning trees;

calculating, by the processor and using the minimum spanning trees, power output relationships among the wind turbines;

creating, by the processor, a finite state space Markov chain forecast model for the wind turbines in the wind farm;

creating, by the processor, a support vector machine (SVM) model for each state in the Markov chain;

integrating, by the processor, the SVM model into the Markov model to generate a forecast of the wind farm power generation;

transmitting, by the processor, the forecast of the wind farm power generation to a manager of the electrical grid; and based on the forecast of the wind farm power generation, reducing, by the manager of the electrical grid, excessive fossil fuel consumption arising from undesired excess electrical generation at the fossil fuel power plant.

2. The method of claim 1, wherein the forecast of the wind farm power generation is generated using the equation $$\hat{P}_{ag}^{SVM}(t+1) = P_{ag}(t) + R_{j*}^k,$$

wherein $P_{ag}(t) \in [\Gamma_k, \Gamma_{k+1})$ is the current observed wind farm power generation, wherein the corresponding forecast state $S_{\hat{k}}$ is the state satisfying $\hat{P}_{ag}^{SVM}(t+1) \in [\Gamma_{\hat{k}}, \Gamma_{\hat{k}+1})$, and wherein:

$S_{\hat{k}}$ is a forecast state using the SVM model;
$\Gamma_k$ is a wind farm generation level;
$P_{ag}(t)$ is the aggregate power output of the wind farm at time t; and
$\hat{P}_{ag}^{SVM}$ is the forecast of the wind farm power generation.

3. The method of claim 2, wherein the forecast of the wind farm power generation is a distributional forecast, and wherein the distributional forecast is generated using the equation $$Pr(P_{ag}(t+1) = P_{ag,j} \mid S(t)$$
$$= S_k, x(t))$$
$$= \begin{cases} q_k; & \text{if } j = \hat{k}; \\ (1-q_k)\dfrac{Q_{kj}}{\sum_{l \ne \hat{k}} Q_{kl}}, & \text{otherwise,} \end{cases}$$

wherein:

S(t) is the state of the Markov chain at time t;

$x(t) \in \mathbb{R}^l$ is the observed wind farm power generation at time t;

$q_k$ is the transition probability from $S_k$ to $S_{\hat{k}}$; and

Q is a transition matrix of the Markov chain.

4. The method of claim 3, further comprising generating, by the processor, a point forecast from the distributional forecast, and wherein the point forecast is generated using the equation $$\hat{P}_{ag}(t+1) = P_{ag,\hat{k}} q_k + \sum_{j \ne \hat{k}} P_{ag,j}(1-q_k)\dfrac{Q_{kj}}{\sum_{l \ne \hat{k}} Q_{kl}}.$$

5. The method of claim 1, wherein each minimum spanning tree:

comprises a subset of the wind turbines in the wind farm;

identifies a parent turbine for each wind turbine in the subset; and guarantees that each wind turbine in the subset is linked to a root turbine of the subset.

6. The method of claim 5, wherein the wind turbine is the root turbine in a minimum spanning tree.

7. The method of claim 1, wherein the creating, b the processor, a support vector machine (SVM) model for each state in the Markov chain is performed in parallel to improve computational efficiency.

8. The method of claim 1, wherein the forecast of the wind farm power generation indicates the presence of a wind ramp.

9. The method of claim 1, wherein the creation of the finite state space Markov chain forecast model utilizes historical data comprising at least one of historical data for wind farm power generation or historical data for wind speed from the meteorological tower.

10. The method of claim 1, wherein the creation of the finite state space Markov chain forecast model utilizes ramp trend information.

11. The method of claim 1, wherein the forecast of the wind farm power generation predicts the power output of the wind farm for a period of between 5 minutes and 1 hour into the future.

* * * * *